(12) United States Patent
Takiar et al.

(10) Patent No.: US 6,900,110 B1
(45) Date of Patent: May 31, 2005

(54) CHIP SCALE PACKAGE WITH COMPLIANT LEADS

(75) Inventors: Hem P. Takiar, Fremont, CA (US); Nikhil Vishwanath Kelkar, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 138 days.

(21) Appl. No.: 10/318,426

(22) Filed: Dec. 13, 2002

Related U.S. Application Data

(62) Division of application No. 09/653,820, filed on Sep. 1, 2000, now Pat. No. 6,521,970.

(51) Int. Cl.[7] .............................................. H01L 21/76
(52) U.S. Cl. ....................... 438/421; 438/461; 438/611; 438/619
(58) Field of Search ................................ 438/319, 411, 438/421, 619, FOR 224, FOR 225, 611, 461

(56) References Cited

U.S. PATENT DOCUMENTS

| 3,594,619 | A | | 7/1971 | Kamoshida |
|---|---|---|---|---|
| 3,647,585 | A | | 3/1972 | Fritzinger et al. |
| 3,925,880 | A | | 12/1975 | Rosvold |
| 4,566,935 | A | * | 1/1986 | Hornbeck ............... 438/29 |
| 4,959,705 | A | | 9/1990 | Lemnios et al. |
| 5,508,229 | A | | 4/1996 | Baker |
| 5,677,576 | A | | 10/1997 | Akagawa |
| 5,834,844 | A | | 11/1998 | Akagawa et al. |
| 5,915,170 | A | | 6/1999 | Raab et al. |
| 5,930,596 | A | * | 7/1999 | Klose et al. .................. 438/98 |
| 5,990,546 | A | | 11/1999 | Igarashi et al. |
| 6,002,168 | A | | 12/1999 | Bellaar et al. |
| 6,020,220 | A | | 2/2000 | Gilleo et al. |
| 6,221,749 | B1 | * | 4/2001 | Kirloskar et al. ........... 438/611 |
| 6,221,750 | B1 | * | 4/2001 | Fjelstad ...................... 438/611 |
| 6,303,986 | B1 | | 10/2001 | Shook |
| 6,713,374 | B2 | * | 3/2004 | Eldridge et al. ............ 438/611 |

FOREIGN PATENT DOCUMENTS

JP          01238146 A  *  9/1989  ........... H01L/21/90

* cited by examiner

*Primary Examiner*—Paul E Brock, II
(74) *Attorney, Agent, or Firm*—Beyer Weaver & Thomas LLP

(57) ABSTRACT

A wafer level fabricated chip scale integrated circuit package having an air gap formed between the integrated circuit die of the package and compliant leads located over and conductively attached to the die is described. Contact bumps offset on the compliant leads provide for connection of the integrated circuit package to other substrates. In some embodiments, the compliant leads include a conductive layer overlaid with an outer resilient layer, and may further include an inner resilient layer beneath the conductive layer. The outer resilient layer has a via formed through it exposing the underlying conductive layer. The via is offset along the compliant lead a horizontal distance from the bond pad to which the compliant lead is conductively coupled. The chip scale package provides a highly compliant connection between the die and any substrate that the die is attached to.

7 Claims, 16 Drawing Sheets

CHIP SCALE PACKAGE WITH COMPLIANT LEADS

This is a divisional application of prior application Ser. No. 09/653,820 filed on Sep. 1, 2000, now U.S. Pat. No. 6,521,970, the disclosure of which is incorporated herein by reference.

FIELD OF THE INVENTION

The present invention relates generally to integrated circuit packages. More specifically, the present invention relates to miniature chip scale packages manufactured in wafer form and improved package structures.

BACKGROUND OF THE INVENTION

With current emphasis on increased circuit density and decreased integrated circuit package footprints, process engineers attempt to design increasingly smaller and more dense integrated circuit packages. A current outgrowth of this emphasis is the chip scale package. Typically, a chip scale package has an overall package dimension that is relatively close to that of the integrated circuit die, or chip, that is enclosed within the package. Generally, chip scale packages are manufactured either using individual chips that have been singulated from a wafer, or in wafer form and then the individual chip scale packages are singulated from the wafer. The latter type of chip scale package is referred to as a wafer level chip scale package.

One example of a wafer level chip scale package is a surface mount die, such as a flip chip package. Surface mount dice typically have input/output contacts, such as solder bumps, that are located on the active surface of the die.

FIG. 1A is a diagrammatic side view of a conventional flip chip package. Typically, the flip chip package 100 includes a die 102 having a plurality of conventionally fabricated integrated circuit structures, such as transistors, etc. (not shown). The top surface of the die 102 includes contact pads 104 which provide for conductive interconnection to the integrated circuit structures of the die 102. Contact bumps 106, such as solder bumps, are conventionally formed on the contact pads 104 to allow for interconnection of the package to other substrates. The bottom surface of the die 102 is conventionally left bare. Typically, a plurality of flip chip packages 100 are formed on the surface of an integrated circuit wafer (not shown). After fabrication of the flip chip packages, the wafer is singulated into individual flip chip packages 100, for example, by laser cutting or sawing. The individual flip chips may then be inverted and attached to a substrate, such as a printed circuit board.

In attaching the flip chip to the substrate, the contact bumps are typically aligned and electrically coupled to an associated board contact of the substrate, for example, by a reflow process, which forms a solder joint. In this way, a high density of input/output pads are provided within a small package footprint as the contact pads are over the die itself. A disadvantage of this design is that stresses introduced on the contact bumps may damage the flip chip package.

FIG. 1B is a diagrammatic side view of a conventional flip chip package attached to a substrate. Typically, the die 102 of the flip chip package 100 and the substrate 110 are formed from different materials that may have substantially different coefficients of thermal expansion. When the flip chip contact bumps 106 are attached to the contact pads 108 of the substrate 110 and power is applied, the resultant heat dissipates in the die 102 and the substrate 110 causing each to expand and contract in different amounts. This causes the contact bumps 106, which are on the contact pads 104 of the die 102, to move relative to the contact pads 108 of the substrate 110.

As the solder joint in this design is a relatively rigid joint structure, the relative movement can deform and stress the contact bumps 106 and may ultimately result in damage to the flip chip package 100, for example, solder joint fatigue. Further, the stresses on the contact bumps 106 may push the contact bumps 106 into the underlying layers that form the die 102 and cause craters within the die 102. Additionally, the stresses may cause the contact bumps 106 to tear open.

To mitigate the effects of the stresses, an underfill layer 112 is typically injected between the substrate 110 and the flip chip package 100 and around the contact bumps 106 of the flip chip package 100. The underfill layer 112 helps to reduce the stress effects of the differential thermal expansion between the die 102 and the substrate 110 and to improve the reliability of the package. However, the addition of the underfill layer 112 results in an extra processing step and increased associated costs, thus impacting overall production costs and production yield. Additionally, as the contact bumps 106 and underfill layer 112 are rigidly attached to the die 102, the package 100 still retains some stress-related problems which can be transferred to and damage the die 102.

Further, the design of the package 100 restrains both the arrangement of the contact bumps 106 and the arrangement of the contact pads 108 of a substrate to the arrangement of the contact pads 104 on the die 102. Thus, this design tends to limit the packaging to use with smaller die sizes/pin counts, for example, 3×3 mm size/28–40 leads.

In an attempt to mitigate the stresses and costs associated with the above-described package, another design, further described in U.S. Pat. No. 5,834,844 to Akagawa et al., describes a wafer level process for forming a chip sized semiconductor package that utilizes a circuit-patterned insulation sheet adhered to a semiconductor die. External contacts for connecting to a substrate are formed on the insulation sheet and are conductively connected to the die through the insulation sheet.

FIG. 2 is a diagrammatic side view of an example of a portion of a conventional semiconductor package utilizing a circuit-patterned insulation sheet adhered to a semiconductor die. The semiconductor package 200 includes an integrated circuit die 202, an insulation sheet 204 adhered to the die 202, a circuit pattern 206 formed on the insulation sheet 204, an electro-insulation layer 208 formed over the circuit pattern 206 and external contacts 210 connected to the circuit pattern 206.

The die 202 typically includes a plurality of conventionally fabricated integrated circuit structures. The top surface of the die 202 includes bond pads 212 that provide interconnection to the integrated circuit structures of the die 202. The die 202 further includes a passivation layer 214 having vias formed over the bond pads 212. A first side of the insulation sheet 204 is attached to the die 202 and the second side has circuit patterns 206 formed on it in a predetermined pattern. The insulation sheet 204 has vias located over the bond pads 212 that are filled with a conductive material to provide a conductive connection between the bond pads 212 and the circuit pattern 206. An electro-insulation layer 208 is formed to cover the insulation sheet 204 and the circuit patterns 206 and has vias formed in it over portions of the circuit pattern 206. Contact bumps 210 are formed within the vias and conductively contact the circuit pattern 206.

Although the insulation sheet 204 may provide some stress absorption, the joint structure is still relatively rigid, and, as the insulation sheet 204 is adhered to the entire surface of the die 202, some of the stresses introduced at the contact bump 210 may still be passed on to the die 202.

Thus, there is a need for a wafer level fabricated chip scale integrated circuit package design having a more compliant connection that can mitigate stresses on the joint and can decouple the stresses from the die.

SUMMARY OF THE INVENTION

To achieve the foregoing, and in accordance with the purpose of the present invention, there are described wafer level chip scale integrated circuit package devices and methods for forming wafer level chip scale integrated circuit packages which provide highly compliant connections between external substrates and the packaged integrated circuit die, and, additionally, provide flexibility in locating the external contacts which may be connected to other substrates.

In one embodiment of the present invention, an integrated circuit package having compliant leads is described. The compliant leads are located over and conductively coupled to at least some of the bond pads on a die such that an air gap having a vertical distance is formed between the integrated circuit die and the compliant leads.

In another embodiment of the present invention, a wafer level method of packaging integrated circuits is described. In this embodiment, a sacrificial layer is deposited over the top surface of an integrated circuit wafer and vias are formed in the sacrificial layer over the bond pads on the various dice. Compliant leads are formed over the bond pads such that each of the compliant leads are conductively coupled to an associated bond pad through a via. The sacrificial layer is removed forming an air gap having a vertical distance between the integrated circuit wafer and the compliant leads. The integrated circuit wafer is then singulated into individual integrated circuit packages.

In another embodiment of the present invention, an integrated circuit wafer is described. A plurality of bond pads are located on the top surface of the integrated circuit wafer. A plurality of compliant leads are located over and conductively coupled to the plurality of bond pads such that an air gap having a vertical distance is formed between the compliant leads and the integrated circuit wafer.

BRIEF DESCRIPTION OF THE DRAWINGS

The present invention may best be understood by reference to the following description taken in conjunction with the accompanying drawings in which.

DETAILED DESCRIPTION OF THE INVENTION

Wafer level chip scale integrated circuit packages having compliant leads and methods for forming such devices are described below. In the following description, numerous specific details are set forth in order to provide a thorough understanding of the present invention. It will be appreciated, however, to one skilled in the art, that the present invention may be practiced without some or all of these specific details. In other instances, well known process operations have not been described in detail in order not to unnecessarily obscure the present invention.

Figure 1A:
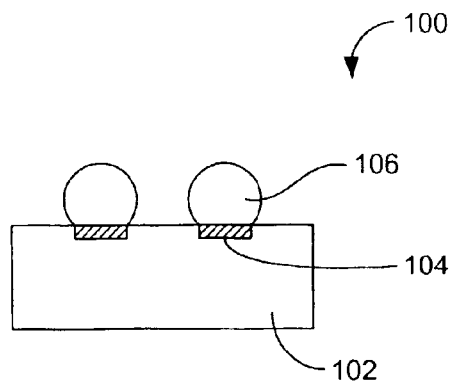
FIG. 1A is a diagrammatic side view of a conventional flip chip package.
Figure 1B:
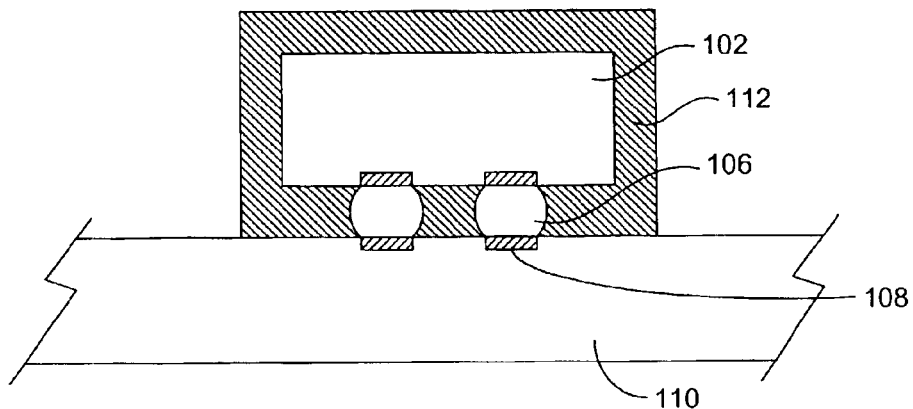
FIG. 1B is a diagrammatic side view of a conventional flip chip package attached to a substrate.
Figure 2:
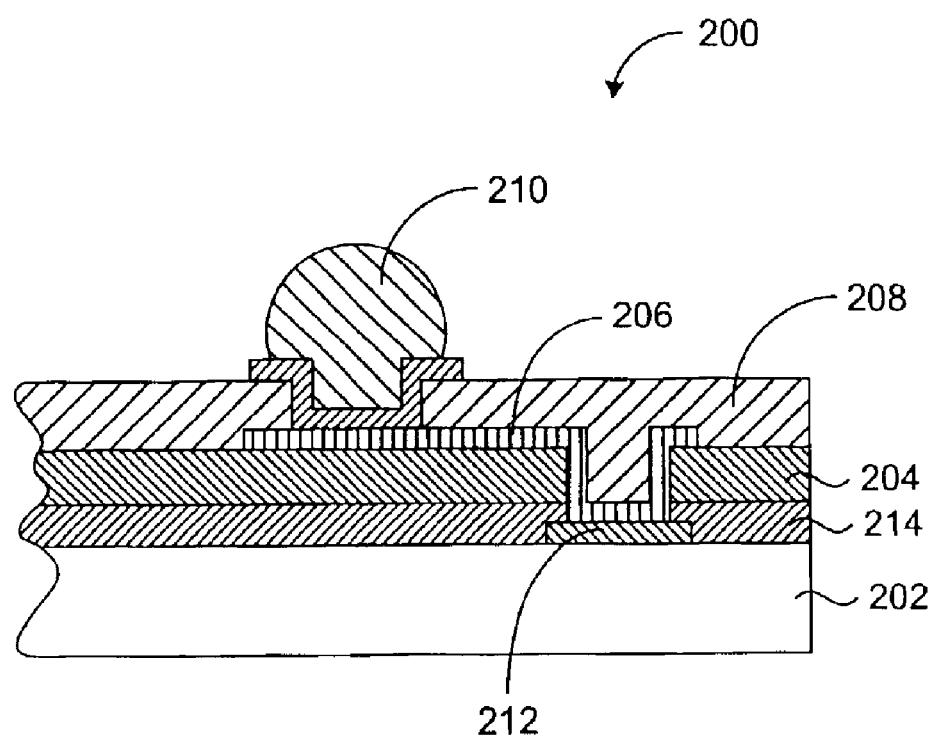
FIG. 2 is a diagrammatic side view of an example of a portion of a conventional semiconductor package utilizing a circuit-patterned insulation sheet adhered to a semiconductor die.
Figure 3:
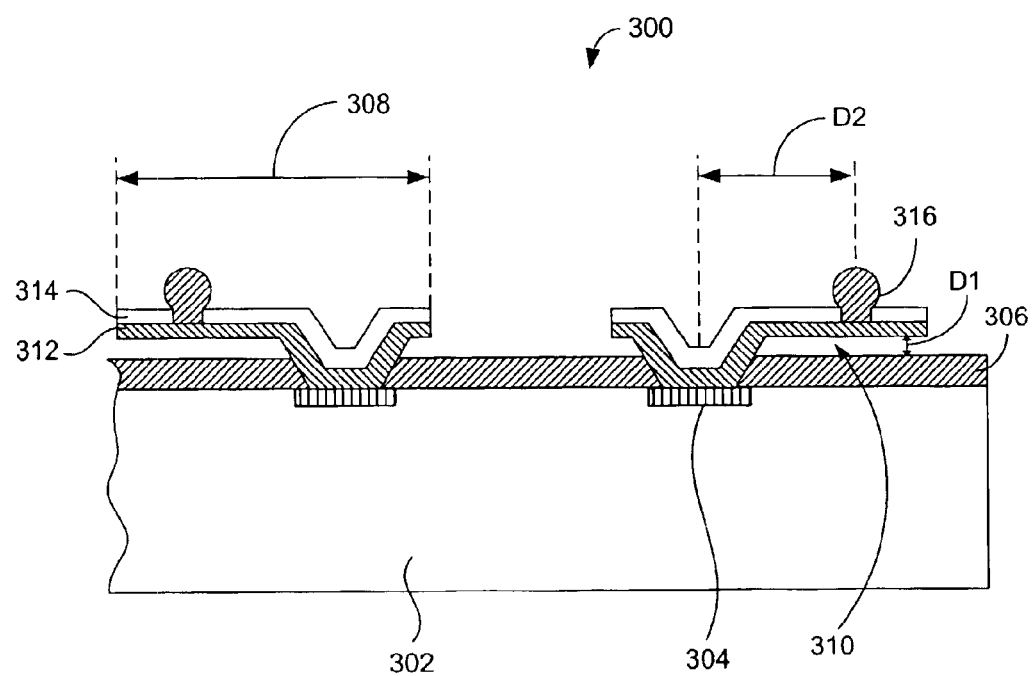
FIG. 3 is a diagrammatic side view illustration of a portion of a wafer level chip scale integrated circuit package having compliant leads in accordance with one embodiment of the present invention.

FIG. 3 is a diagrammatic side view illustration of a portion of a wafer level chip scale integrated circuit package 300 having compliant leads in accordance with one embodiment of the present invention. The package 300 includes an integrated circuit die 302 having a plurality of bond pads 304 formed on the top surface that provide external electrical contacts to various integrated circuit structures within the die 302. Typically, the top surface of the die 302 takes the form of a passivation layer 306 that has passivation vias, or openings, aligned over the bond pads 304. However, as will be appreciated by those skilled in the art, a wide variety of top surface arrangements may be provided on the die 302.

The bond pads 304 may optionally include under bump metallization pads (not shown) formed over and conductively coupled to the bond pads 304. Further descriptions of under bump metallization techniques may be found described in commonly assigned U.S. patent application Ser. No. 09/031,167, filed Feb. 26, 1998, entitled "Surface Mount Die: Wafer Level Chip-Scale Package and Process for Making the Same," by Schaefer et al., and which is incorporated herein by reference.

Compliant leads 308 are located over and conductively coupled to the bond pads 304, such that an air gap 301, having a vertical distance, D1, is formed between the compliant leads 308 and the die 302. In the embodiment shown, the compliant leads 308 extend horizontally over the die 302 to form a cantilever-like structure, e.g., a spring board structure. The structure of the compliant leads 308 may be widely varied. In the illustrated embodiment, the compliant leads 308 have a layered construction that includes a conductive layer 312 and a resilient layer 314 located over the conductive layer. The compliant leads 308 may be formed from a wide variety of materials. By way of example, metals and metal alloys, such as TiCu, have been found to work well as the conductive layer 312. The resilient layer 314 is preferably formed from a stress-absorbing material, such as benzocyclobutene (BCB) or polyimide.

The resilient layer 314 has vias formed in it exposing the conductive layer 312 below. In one embodiment, the via is offset a horizontal distance, D2, from the corresponding bond pad 304, e.g., the bond pad 304 to which the conductive layer 312 is conductively coupled. It should be noted that the offset distance does not have to be the same for each compliant lead 308 and that compliant leads 308 having several different other distances may be present within a package 300.

The compliant leads 308 may further include contact bumps 316 formed on and conductively attached to the conductive layer 312 through the vias. The contact bumps 316 permit connection of the package 300 to another substrate, such as a printed circuit board. Thus, when the package 300 is attached to another substrate, the connection at the contact bumps 316 is horizontally offset from the connection to the die 302 at the bond pads 304.

When coupled to another substrate, the described compliant leads 308 of the package 300 provide a highly flexible connection between the die 302 and the other substrate. The combination of the cantilevered contact structure and the air gap 310 formed between the die 302 and the compliant leads 308 absorbs stresses by allowing the contact bumps 316 of the compliant leads 308 to flex and move inward into the air gap 310 without damaging the die 302. In this way, the air gap 310 decouples some stresses from the die 302 that might otherwise be transferred in a rigid underfill layer or semi-rigid insulating layer adhered to the surface of the die 302. The use of a resilient layer within the compliant lead structure further improves stress absorption.

While the above-described embodiment is illustrated such that the compliant leads 308 extend horizontally out to the edges of the die 302, it will be appreciated that in other instances, it may be desirable that the compliant leads 308 extend horizontally inward from the edges of the die 302, or extend horizontally at other angles relative to the edges of the die 302. For example, the compliant leads 308 may extend horizontally in a variety of different directions from those illustrated to increase the contact density and/or to mitigate stresses associated with a particular die array of bond pads. In this way, the compliant leads 308 further provide some flexibility in locating the contacts to external substrates.

Figure 4:
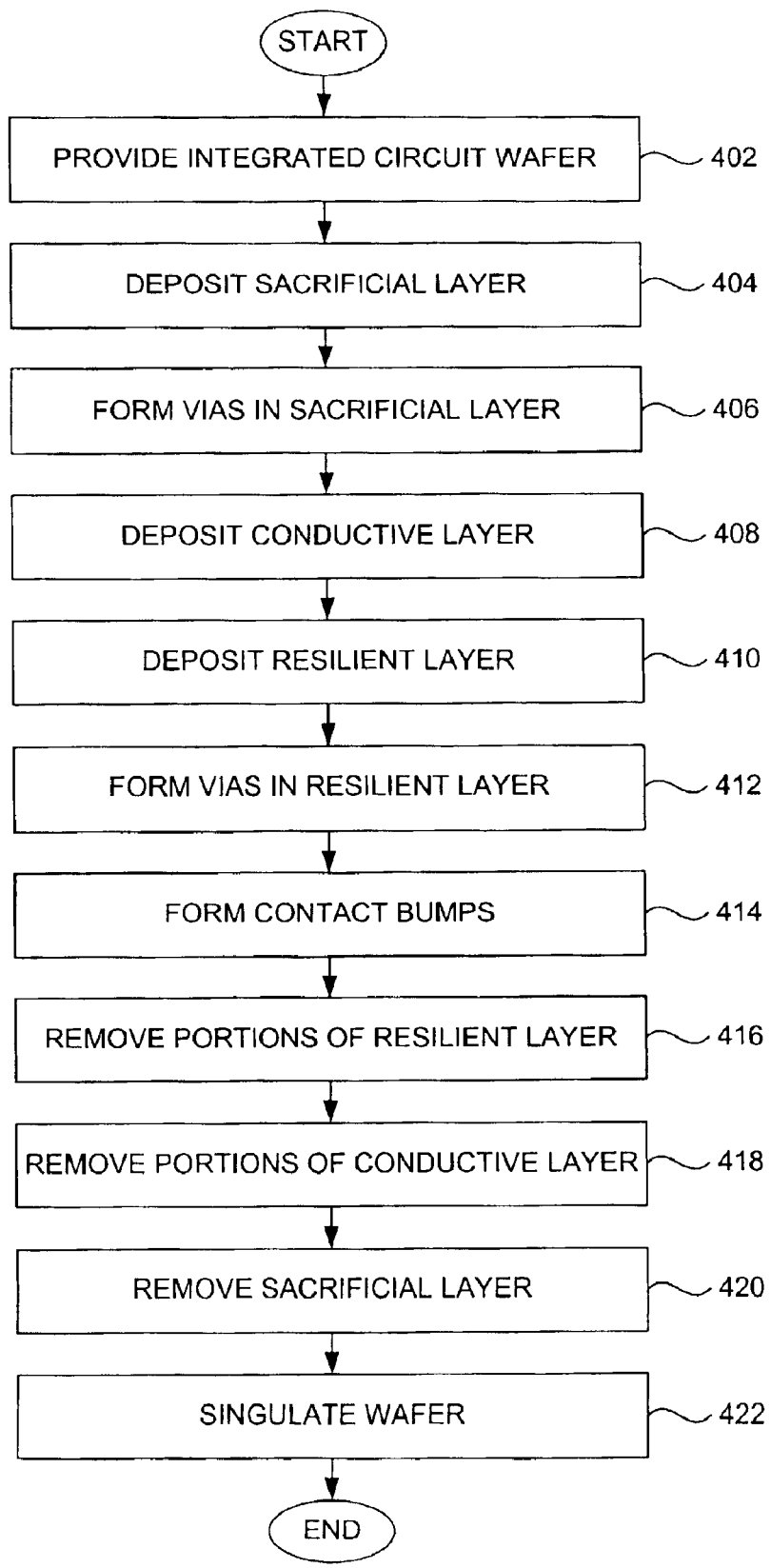
FIG. 4 is a flow chart illustrating a method for fabricating the wafer level chip scale integrated circuit package of FIG. 3 in accordance with one embodiment of the present invention.

FIG. 4 is a flow chart illustrating a method for fabricating the wafer level chip scale integrated circuit package of FIG. 3 in accordance with one embodiment of the present invention. Each of the operations described in the method 400 is further detailed in FIGS. 5A–5K.

FIGS. 5A–5K are diagrammatic side views of a portion of an integrated circuit wafer as it is fabricated into a wafer level chip scale integrated circuit package in accordance with the embodiment of the method illustrated in the flow chart of FIG. 4.

Figure 5A:
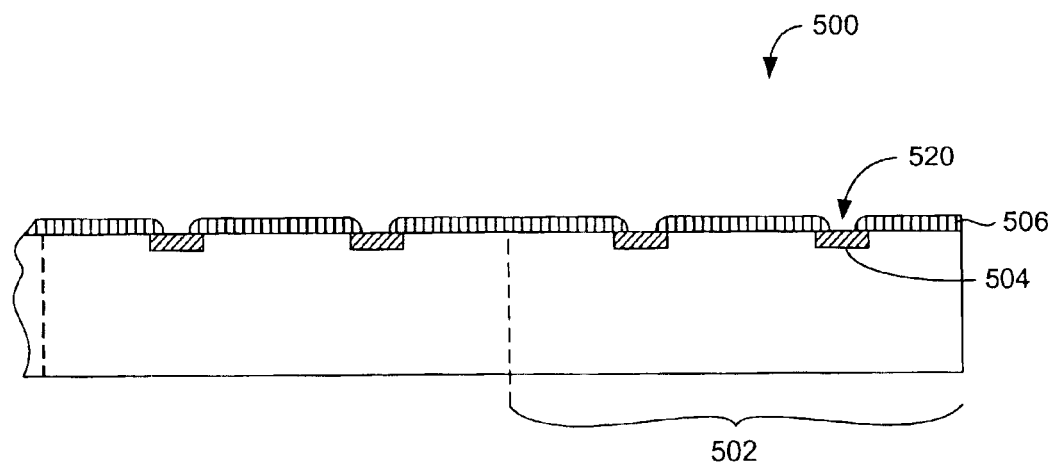
FIGS. 5A–5K are diagrammatic side views of a portion of an integrated circuit wafer as it is fabricated into a wafer level chip scale integrated circuit package in accordance with the embodiment of the method illustrated in the flow chart of FIG. 4.

Initially, an integrated circuit wafer 500 is provided. As shown in FIG. 5A, the integrated circuit wafer 500 typically includes an array of dice 502. As earlier described, each integrated circuit die 502 may include a plurality of integrated circuit structures, and further includes a plurality of bond pads 504 at the top surface of the wafer 500 that connect to the integrated circuit structures of the die 502.

The top surface of the wafer 500 typically takes the form of a passivation layer 506 having passivation vias 520 located over bond pads 504. As earlier described, the bond pads 504 may optionally include under bump metallization pads (not shown) formed over and conductively coupled to the bond pads 504.

Figure 5B:
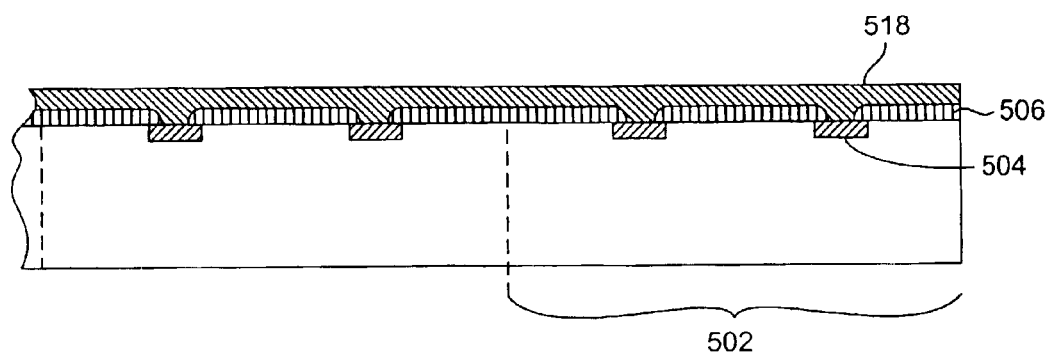

In operation 404, a sacrificial layer 518 is deposited on the wafer 500. As shown in FIG. 5B, the sacrificial layer 518 is deposited on the wafer 500 including the bond pads 504. The sacrificial layer 518 may be formed of any material that remains substantially intact through the various process steps described herein and yet is removable prior to singulation without damage to the wafer 500 or the structures formed thereon.

The sacrificial layer 518 may be deposited by any method suitable for producing a substantially even layer on the surface of the wafer 500, such as spinning or printing. In one embodiment, the sacrificial layer 518 may be formed by depositing a layer of a water-soluble material such as WonderMask® W-UVA (manufactured by Techspray, Inc. of Amarillo, Tex.) and spinning it out to form an even layer on the wafer 500. It should be noted that the thickness of the sacrificial layer 518 determines the vertical distance, D1, of the later formed air gap. The thickness of the sacrificial layer 518 may be widely varied in accordance with the needs of a particular system. By way of example, thicknesses in the range of between about 1 $\mu$m to 50 $\mu$m, as for example, 25 $\mu$m, have been found to work well. Additionally, the sacrificial layer 518 serves as an etch barrier over the dice 502 during the formation of the compliant leads 508.

Figure 5C:
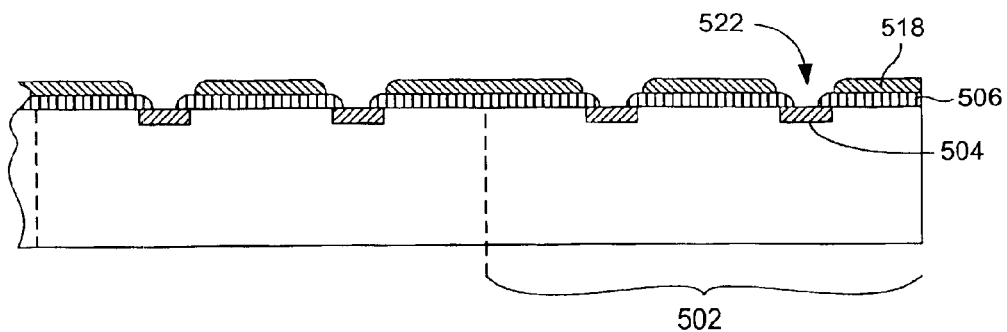

After the sacrificial layer 518 has been applied, vias 522 are formed in the sacrificial layer 518 in operation 406. As shown in FIG. 5C, the vias 522 are formed through the sacrificial layer 518 and the passivation vias 520 exposing the bond pads 504. The vias 522 may be slightly larger than the passivation vias 520 to aid in processing alignment. However, it will be appreciated that this enlargement is not necessary, and the vias 522 may be differently sized, for example, the vias 522 may be formed substantially the same size as the passivation vias 520. The vias 522 may be formed using conventional photolithography techniques.

Figure 5D:
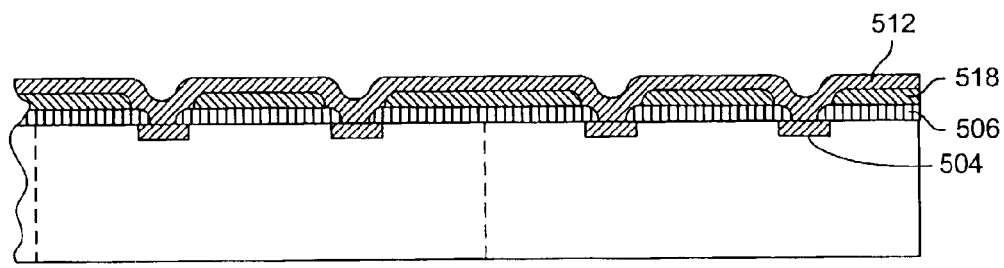

The formation of the compliant leads begins in operation 408, with the depositing of a conductive layer 512 over the wafer 500. As shown in FIG. 5D, the conductive layer 512 is deposited over sacrificial layer 518 including the bond pads 504 and into the vias 520 and 522. The conductive layer 512 may be formed of any conductive material suitable for use in the fabrication process, for example, metals, and metal alloys. Further, the conductive layer 512 should be a material that bonds well with the bond pad 504, or, if applicable, the under bump pad formed over the bond pad 504. The conductive layer 512 may be formed of multiple layers of conductive materials or a combination of materials. The conductive layer 512 may be formed using any method suitable to a thin or thick layer deposition of the chosen conductive material, for example, vapor deposition and/or plating. In one embodiment, the conductive layer 512 may be a sputter deposited metal layer, such as TiCu. The thickness of the conductive layer may be widely varied. By way of example, thicknesses in the range of between about 10,000 angstroms to 30,000 angstroms, as for example 22,000 angstroms, have been found to work well.

In other embodiments, the sputtered metal layer may be further built up by plating of the same or other metals on the sputtered metal layer. Additionally, the materials may be chosen to allow the later deposited contact bumps to be formed by plating. By way of example, solder bump formation using plating techniques may be found described in commonly assigned U.S. Pat. No. 5,508,229 to Mark H. Baker.

Figure 5E:
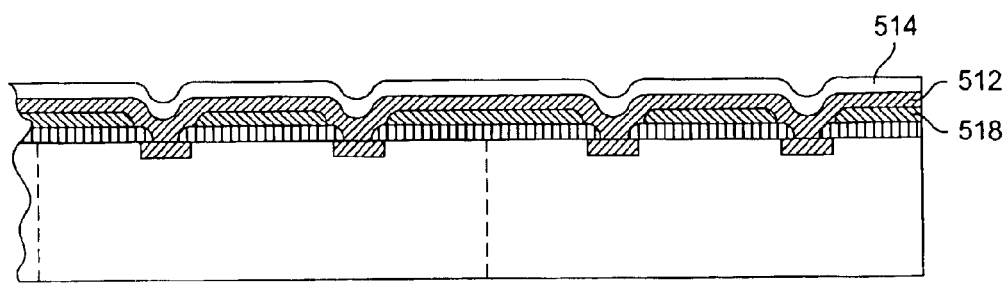

In operation 410, a resilient layer 514 is deposited on the wafer 500. As shown in FIG. 5E, the resilient layer 514 is deposited over the conductive layer 512. The resilient layer 514 may be formed of any material that is suitable for absorbing stresses introduced at the contact bump. In one preferred embodiment, the material is also photoimageable. For example, some photoresist materials, such as polyimide and benzocyclobutene (BCB) are suitable materials. The resilient layer 514 may be deposited by any method suitable for producing an even layer over the wafer 500, such as spinning or printing. In the present embodiment, the resilient layer 514 may be formed by depositing and spinning a layer of benzocyclobutene (BCB) over the wafer. The thickness of the resilient layer 514 may be widely varied. By way of example, thicknesses in the range of between about 3 $\mu$m to 8 $\mu$m, as for example, 4.6 $\mu$m have been found to work well. In other embodiments, the resilient layer 514 may be formed by depositing several thin layers of materials to "build" the resilient layer 514. In still other embodiments, the resilient layer 514 may be eliminated.

Figure 5F:
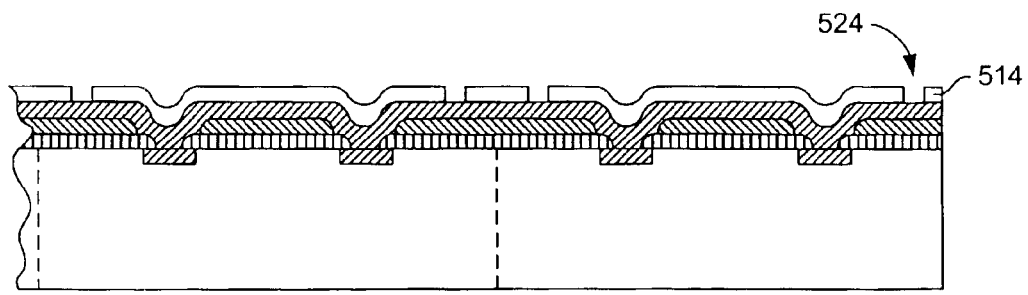

In operation 412, vias 524 are formed in the resilient layer 514. As shown in FIG. 5F, the resilient layer 514 is patterned according to a predetermined pattern and portions of the resilient layer 514 are removed forming vias 524 exposing the underlying conductive layer 512. As earlier described, a via 524 is formed so that it is offset on the later formed compliant lead a horizontal distance, D2, from the bond pad 504 associated with the compliant lead. Further, a variety of offset distances may be used within the same integrated circuit package. The vias 524 may be formed using conventional photolithography techniques.

Figure 5G:
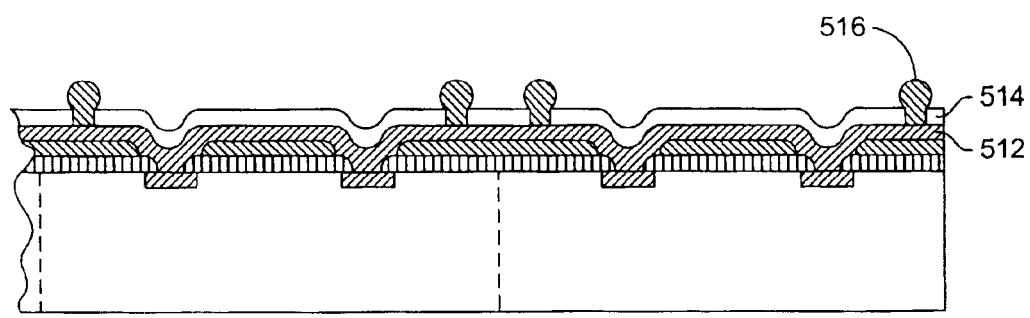

In operation 414, contact bumps 516 are formed on the conductive layer 512. As shown in FIG. 5G, contact bumps 516 are formed on and conductively coupled to the conductive layer 512 through the vias 524. The contact bumps 516 may be formed using conventional solder bumping or balling techniques, or by plating as earlier described.

Figure 5H:
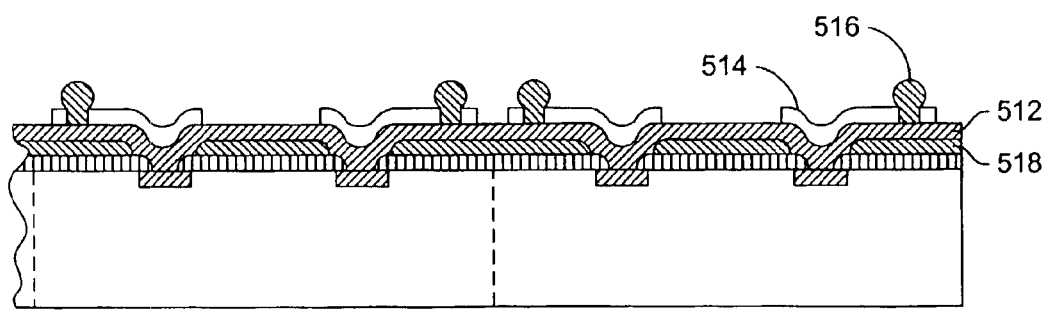

In operation 416, portions of the resilient layer 514 are removed. As shown in FIG. 5H, the resilient layer 514 is patterned according to a predetermined pattern for forming the compliant leads, and portions of the resilient layer 514 that will not form part of the compliant leads are removed, exposing portions of the underlying conductive layer 512. Patterning and removal of portions of the resilient layer 514 may be performed using conventional photolithography techniques. It should be noted that the etchant or solvent used to remove portions of the resilient layer 514 should not attack the contact bumps 516.

It will be appreciated that if the material of the resilient layer 514 is a photoresist material, such as benzocyclobutene (BCB), the patterned resilient layer 514 may serve as a mask pattern for subsequent etching of the underlying conductive layer 512. In other embodiments, where a non-photoresist material is used, or for other processing considerations, the mask used to pattern the resilient layer 514 may remain in place for use in patterning the underlying conductive layer 512 and then be removed.

Figure 5I:
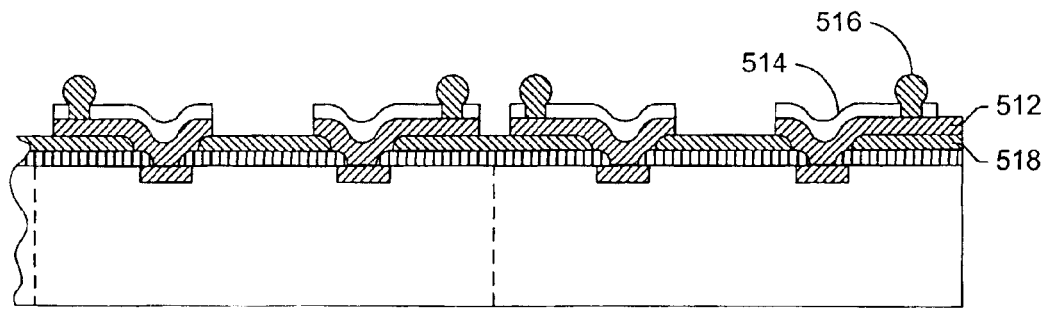

In operation 418, portions of the conductive layer 512 are removed. As shown in FIG. 5I, portions of the conductive layer 512 that will not form part of the compliant leads are removed, exposing portions of the underlying sacrificial layer 518. Patterning and removal of portions of the conductive layer 512 may be performed using conventional photolithography techniques. The conductive layer 512 may be removed using conventional etchants or solvents which will remove the conductive layer but will not attack the contact bumps 516, the resilient layer 514, or the sacrificial layer 518.

Figure 5J:
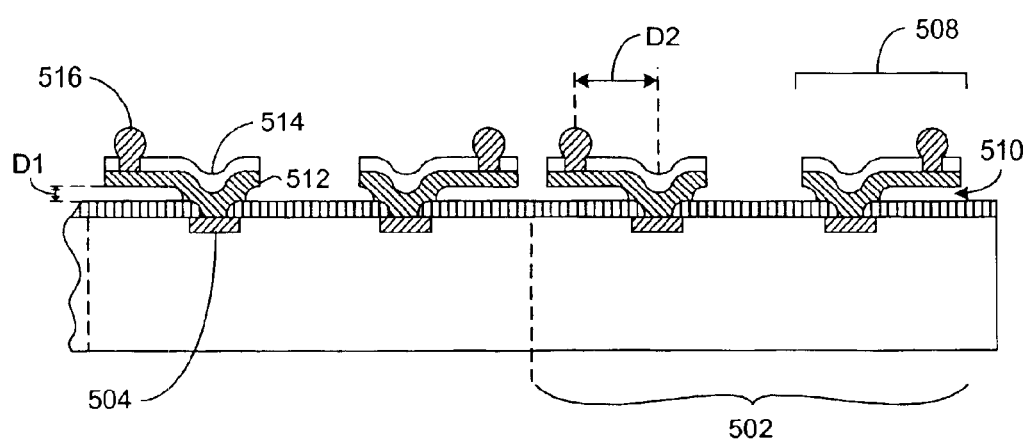

In operation 420, the sacrificial layer 518 is removed. As shown in FIG. 5J, the removal of the sacrificial layer 518 leaves the compliant leads 508 attached to the wafer 500 and forms an air gap 510 having a vertical distance, D1, between the compliant leads 508 and the wafer 500. The sacrificial layer 518 is removed using a process suitable to the sacrificial material chosen. As earlier described, the vertical distance may widely vary. By way of example, the air gaps having vertical distances in the range of between about 1 $\mu$m to 50 $\mu$m, as for example, 25 $\mu$m, have been found to work well.

As illustrated, the compliant leads 508 extend vertically above the surface of the wafer 500 and horizontally over the wafer 500. The contact bumps 516 are offset on the compliant leads 508 a horizontal distance, D2, from the bond pad 504 coupled with the respective compliant lead 508. The horizontal offset distance may be measured from the center of the bond pad 504 to the center of the via 524. However it will be appreciated that other measures of the offset distance, D2, may be used. The horizontal offset distance may vary widely. By way of example, horizontal offset distances in the range of between about 50 $\mu$m to 1,000 $\mu$m, as for example, 250 $\mu$m, have been found to work well.

Figure 5K:
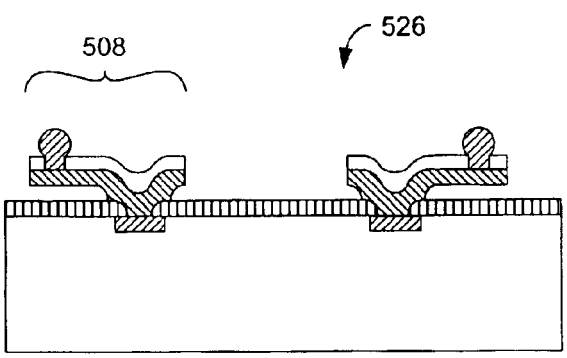

In operation 422, the wafer 500 is singulated. As shown in FIG. 5K, the integrated circuit wafer 500 is singulated into individual wafer level chip scale integrated circuit packages 526. The integrated circuit wafer 500 may be singulated using conventional methods, such as laser cutting, or sawing.

Optionally, prior to singulation, in another embodiment, the bottom surface of the wafer 500 may be thinned to reduce the thickness of the packages 526. Thinning the wafer 500 introduces more compliancy into the later formed wafer level chip scale packages 526 and may provide further mitigation of stresses received by the packages 526 when attached to another substrate. The thinning may be accomplished using conventional wafer thinning techniques, such as grinding.

Following singulation, the individual wafer level chip scale packages 526 are then ready for attachment to other substrates, such as printed circuit boards.

As will be appreciated, the present invention provides for wafer level fabrication of thousands of integrated circuit packages. To illustrate this more clearly, various aspects of the present invention are described from a wafer level view.

Figure 6A:
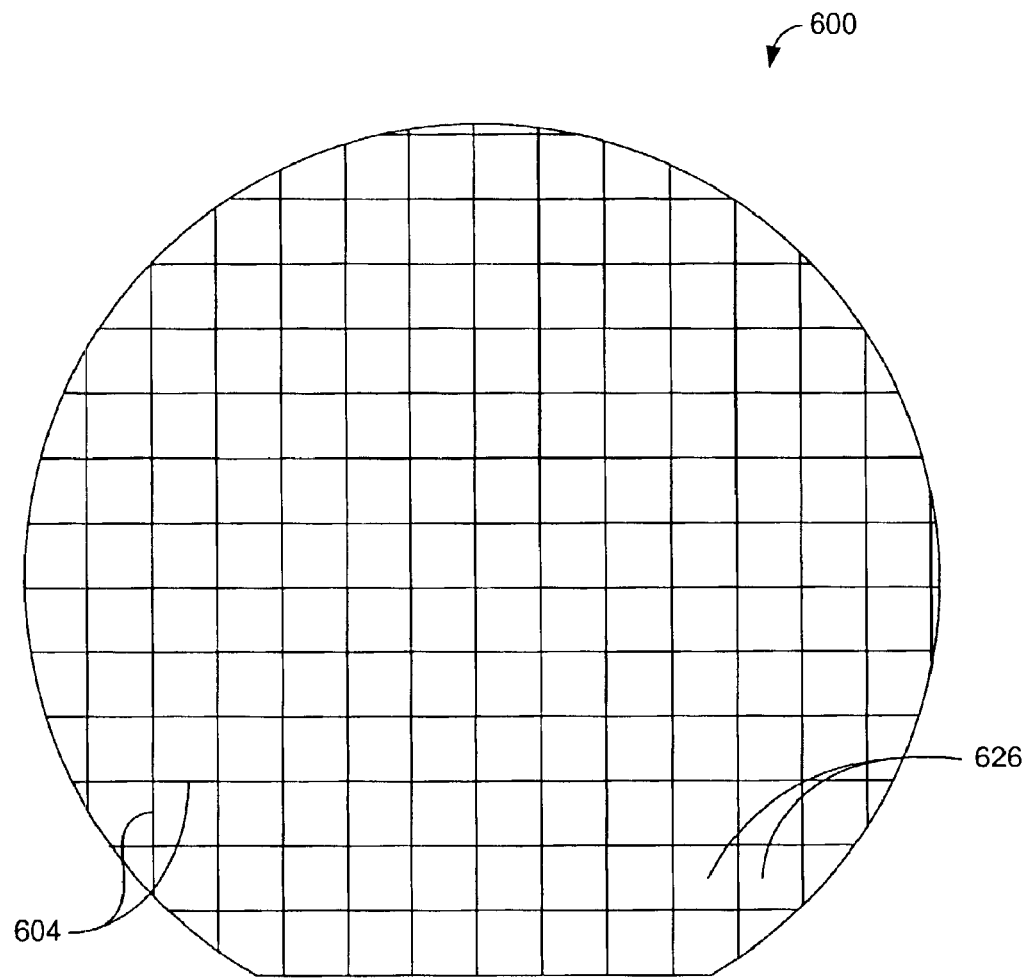
FIG. 6A is a diagrammatic top view of a wafer that includes a plurality of the wafer level chip scale integrated circuit packages in accordance with one embodiment of the present invention.

FIG. 6A is a diagrammatic top view of a wafer that includes a plurality of the wafer level chip scale integrated circuit packages in accordance with one embodiment of the present invention. In the illustration, the wafer 600 is not drawn to scale and the wafer 600 may include thousands, tens of thousands, or more integrated circuit packages 626. Typically, scribe lines 604 are positioned between each package 602. When the wafer 600 is singulated, or diced, the dicing tool cuts along the scribe lines 604.

Additionally, a protective film (not shown) may be deposited over the bottom surface of the wafer 600 to aid in reducing chipping during the wafer singulation process.

Preferably, the protective film is in the form of a thick film and is formed by any suitable process for applying a thick film, for example, a screen printing process. In another example, a spinning type process may be used, so that a thick film is spread across the bottom surface of the wafer. Several embodiments of methods for forming a protective thick film on the bottom surface of the wafer are described in commonly assigned U.S. patent application Ser. No. 09/006,759, filed Jan. 14, 1998, entitled, "Semiconductor Wafer Having a Bottom Surface Protective Coating," by Kao et al., and in commonly assigned U.S. patent application Ser. No. 09/391,854, filed Sep. 8, 1999, entitled "Semiconductor Wafer Having a Bottom Surface Protective Coating," by Kao et al., which are incorporated herein by reference.

Figure 6B:
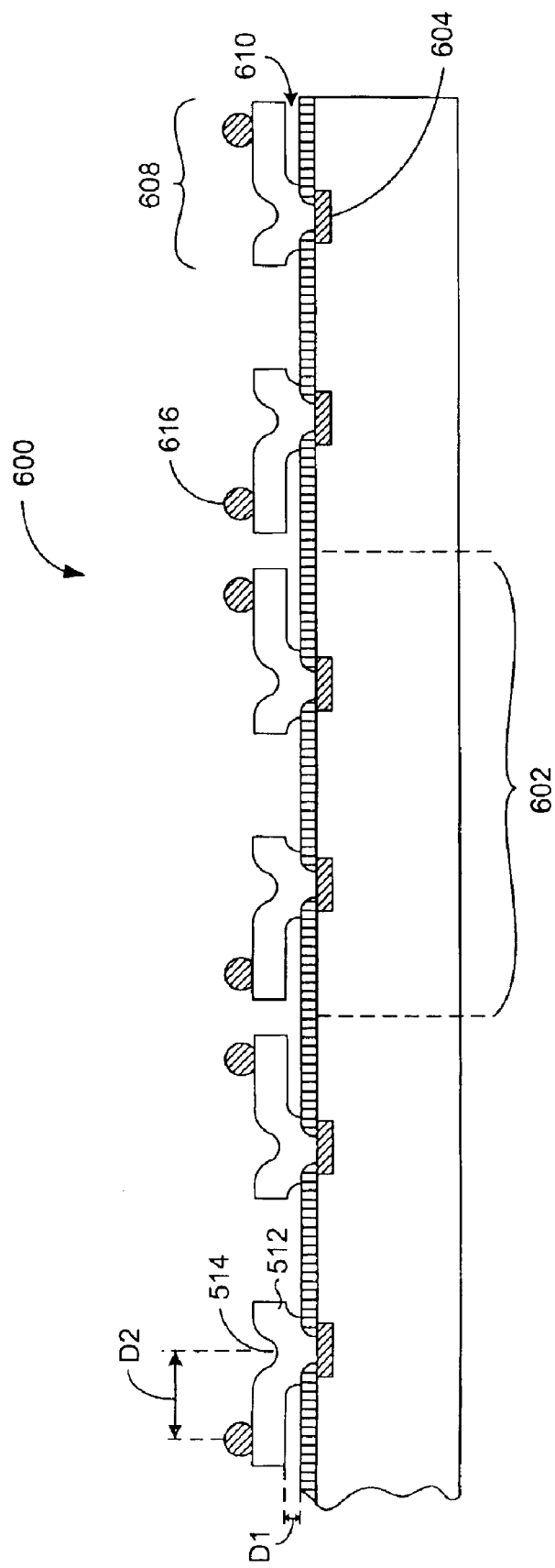
FIG. 6B is a diagrammatic side view of a portion of the wafer of FIG. 6A that includes a plurality of wafer level chip scale integrated circuit packages in accordance with one embodiment of the present invention.

FIG. 6B is a diagrammatic side view of a portion of the wafer of FIG. 6A that includes a plurality of wafer level chip scale integrated circuit packages in accordance with one embodiment of the present invention. Prior to singulation, the wafer 600 includes compliant leads 608 conductively coupled to the bond pads 604 of the integrated circuit die 602. An air gap 610, having a vertical distance, D1, is formed between the compliant leads 608 and the wafer 600. The contact bumps 616 are offset on the compliant leads 608 a horizontal distance, D2, from the bond pads 604. Thus, the contact bumps 616 are conductively coupled to the die 602 through a highly compliant connection.

Alternative Embodiments

As earlier described with reference to FIG. 3, one embodiment of the present invention includes compliant leads 308 having a resilient layer 314 formed over a conductive layer 312. In some applications, it may be desirable to provide an additional resilient layer beneath the conductive layer, so that the conductive layer is "sandwiched" between the two resilient layers. For example, the additional resilient layer may provide additional structural support to very thin or brittle conductive layers, further stress absorption, and/or additional protection from environmental factors, such as corrosion.

Figure 7:
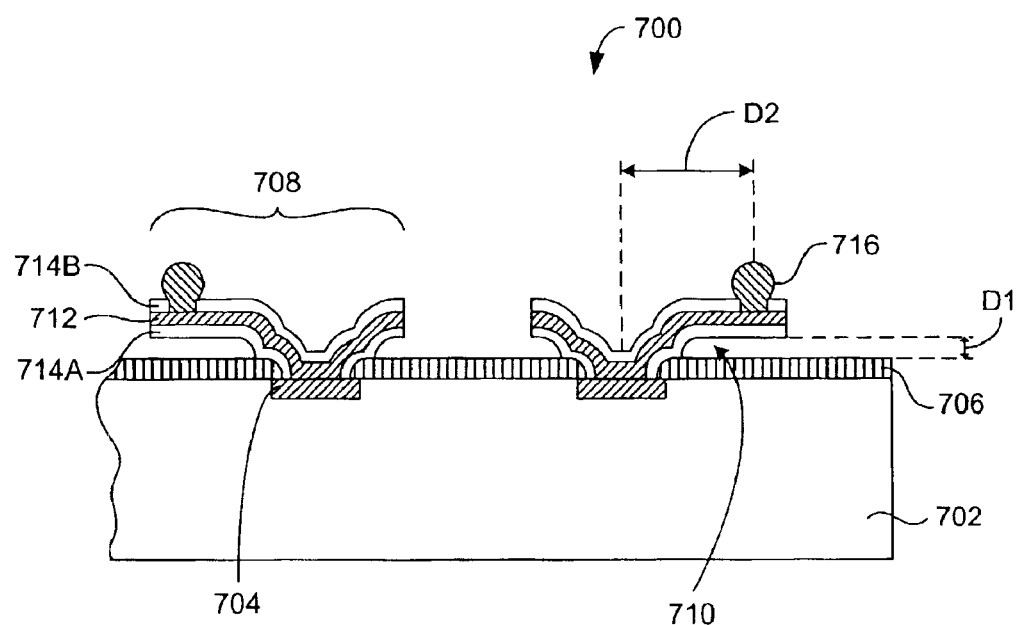
FIG. 7 is a diagrammatic side view illustration of a portion of a wafer level chip scale integrated circuit package having compliant leads in accordance with another embodiment of the present invention.

FIG. 7 is a diagrammatic side view illustration of a portion of a wafer level chip scale integrated circuit package having compliant leads in accordance with another embodiment of the present invention.

In one embodiment, the wafer level chip scale integrated circuit package 700 includes an integrated circuit die 702 as earlier described. The die 702 may include a plurality of integrated circuit structures, and further includes bond pads 704 formed on the top surface that may be coupled to at least one of the integrated circuit structures. The top surface of the die 702 typically takes the form of a passivation layer 706 having passivation vias located over bond pads 704. However, a wide variety of top surface arrangements may be provided on the die 702. As earlier described, the bond pads 704 may optionally include under bump metallization pads (not shown) formed over and conductively coupled to the bond pads 704.

Compliant leads 708 are located over and conductively coupled to the bond pads 704, such that an air gap 710, having a vertical distance, D1, is formed between the compliant leads 708 and the die 702. It should be noted that the compliant leads 708 extend vertically above the plane of the die 702 and then extend horizontally over die 702 to form a cantilever-like structure. In one embodiment, the compliant leads 708 include an inner resilient layer 714A, a conductive layer 712, and an outer resilient layer 714B. In one embodiment, the conductive layer 712 may be a metal layer, such as TiCu, and the resilient layers 714A and 714B may be a stress-absorbing material, such as benzocyclobutene (BCB) or polyimide.

The outer resilient layer 714B has a via formed in it exposing the conductive layer 712 below. In one embodiment, the via is offset a horizontal distance, D2, from the corresponding bond pad 704, e.g., the bond pad 704 to which the conductive layer 712 is conductively coupled. As earlier described, the offset distance does not have to be the same for each compliant lead 708 and that different offset distances may be present within a package 700.

The compliant leads 708 may further include contact bumps 716 formed on and conductively coupled to the conductive layer 712 through the vias. The contact bumps 716 permit connection of the package 700 to another substrate, such as a printed circuit board. Thus, when the package 700 is attached to another substrate, the connection at the contact bumps 716 is horizontally offset from the connection to the die 702 at the bond pads 704.

It will be appreciated that as earlier described with reference to FIG. 3, the compliant leads 708 provide a highly flexible connection between the die 702 and another substrate, and, the additional resilient layer, e.g., inner resilient layer 714A, provides structural support and additional stress absorption to the compliant leads 708.

Also, as earlier described, while the present embodiment is illustrated such that the compliant leads 708 extend horizontally out to the edges of the die 702, it will be appreciated that in other instances, it may be desirable that the compliant leads 708 extend horizontally inward from the edges of the die 702, or extend horizontally at other angles relative to the edges of the die 702. Additionally, the compliant leads 708 may be arranged at different angles from those illustrated to increase the contact density and/or to mitigate stresses associated with a particular die array of bond pads. In this way, as in the earlier embodiment illustrated in FIG. 3, the compliant leads 708 also provide some flexibility in locating the contacts to the external substrate.

Figure 8:
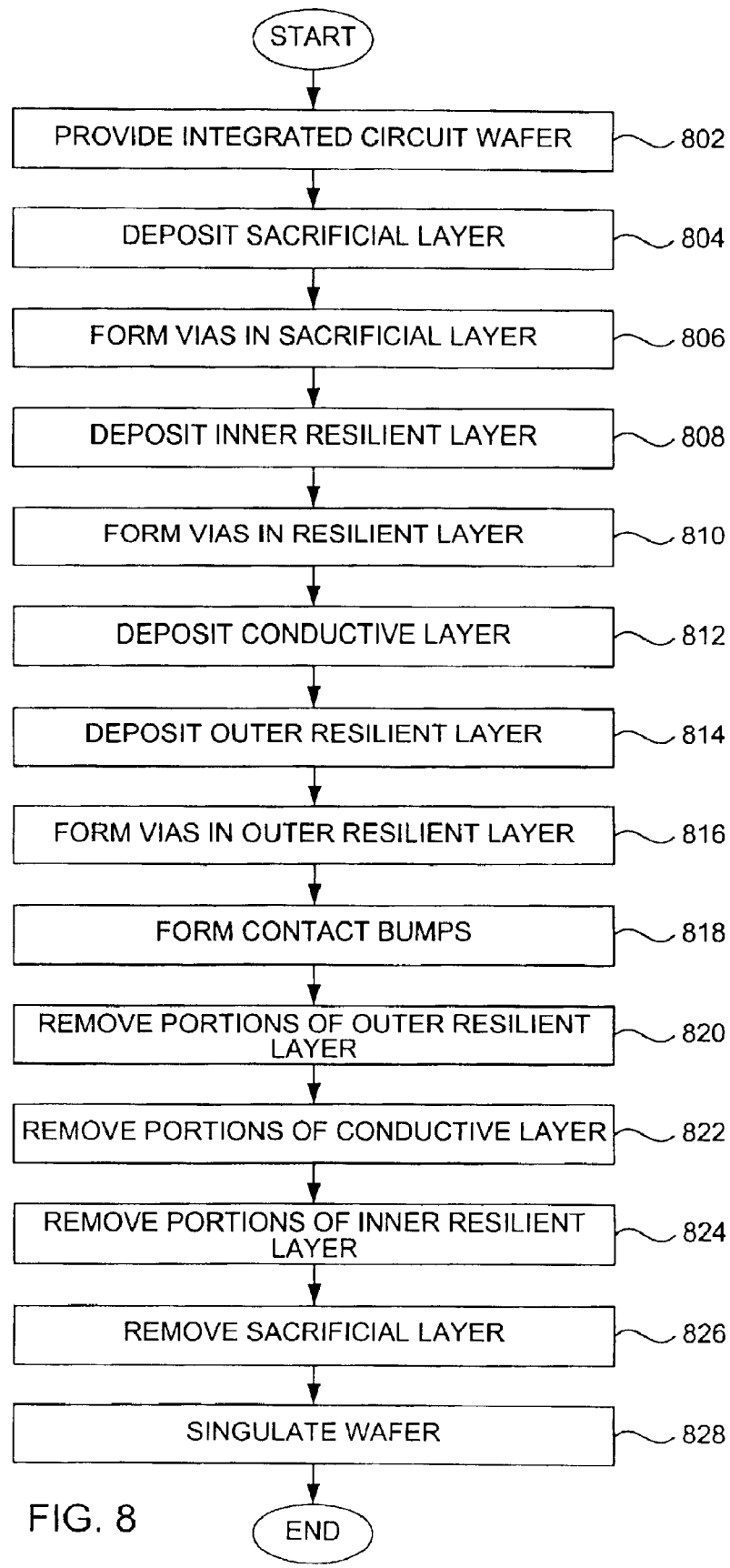
FIG. 8 is a flow chart illustrating a method for fabricating the wafer level chip scale integrated circuit package illustrated in FIG. 7 in accordance with another embodiment of the present invention.

FIG. 8 is a flow chart illustrating a method for fabricating the wafer level chip scale integrated circuit package of FIG. 7 in accordance with one embodiment of the present invention. Each of the operations described in the method 800 is further detailed in FIGS. 9A–9N.

Figure 9A:
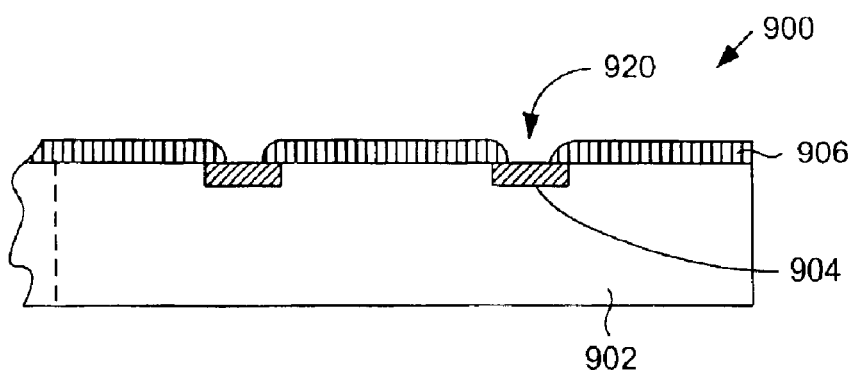
FIGS. 9A–9N are diagrammatic side views of a portion of an integrated circuit wafer as it is fabricated into a wafer level chip scale integrated circuit package in accordance with the embodiment of the method illustrated in the flow chart of FIG. 8.
Figure 9B:
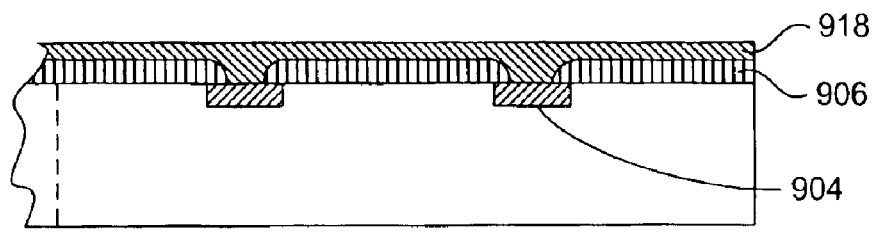
Figure 9C:
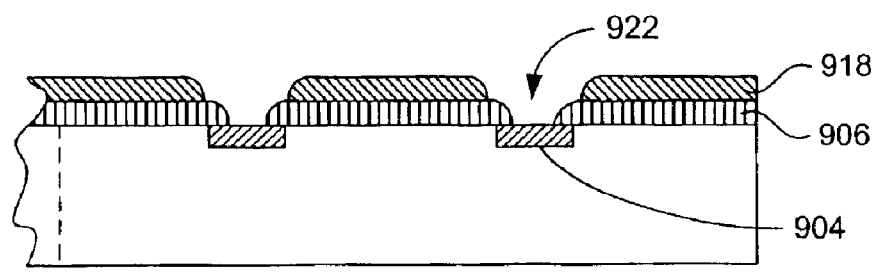
Figure 9D:
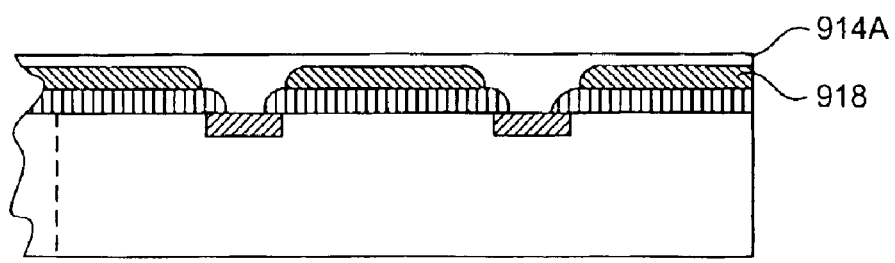
Figure 9E:
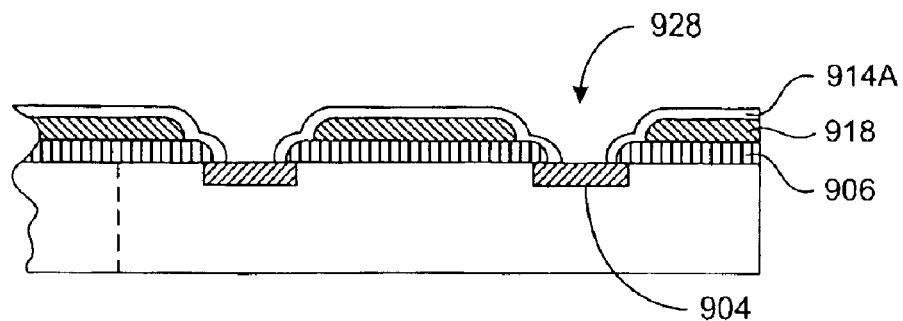
Figure 9F:
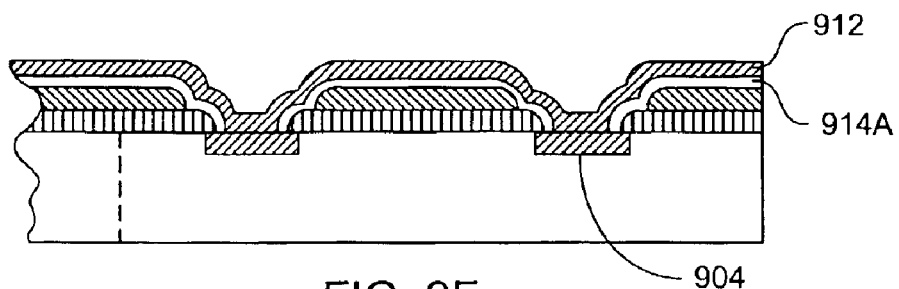
Figure 9G:
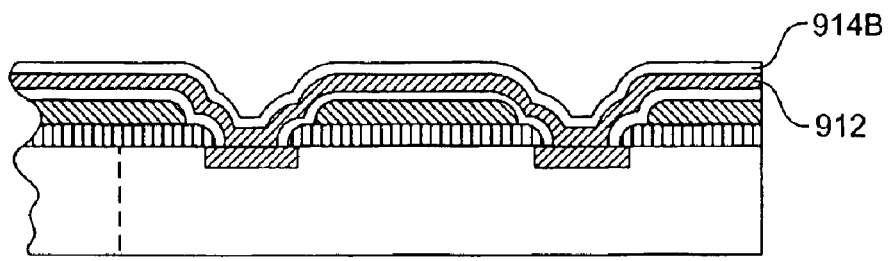
Figure 9H:
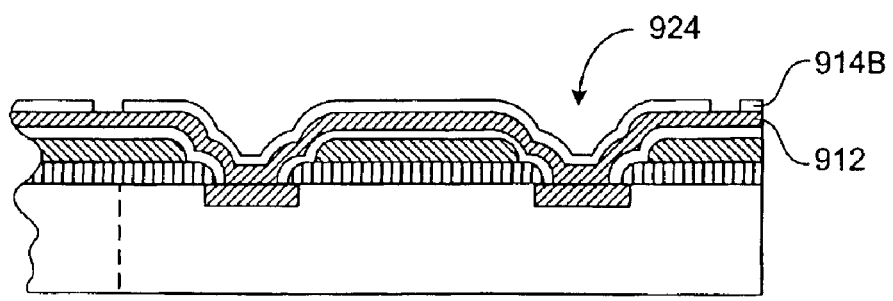
Figure 9I:
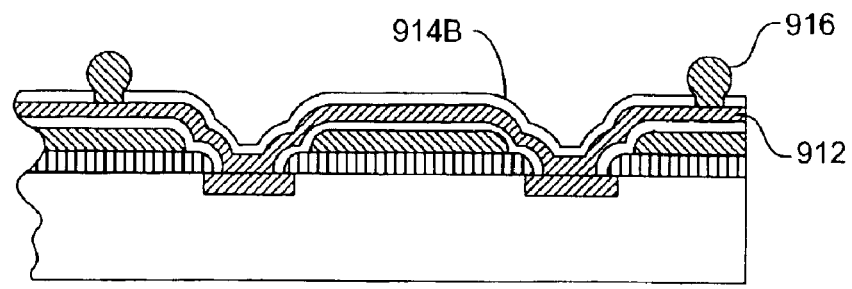
Figure 9J:
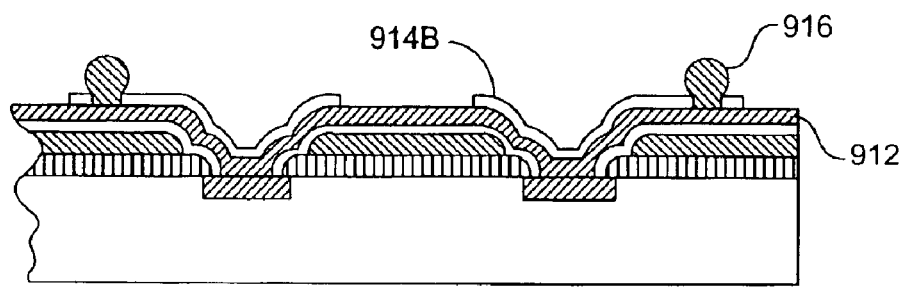
Figure 9K:
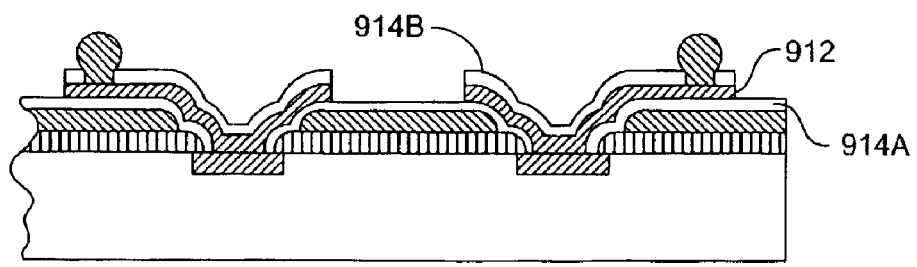
Figure 9L:
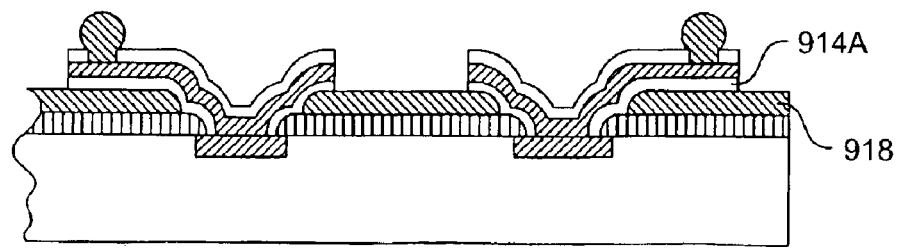
Figure 9M:
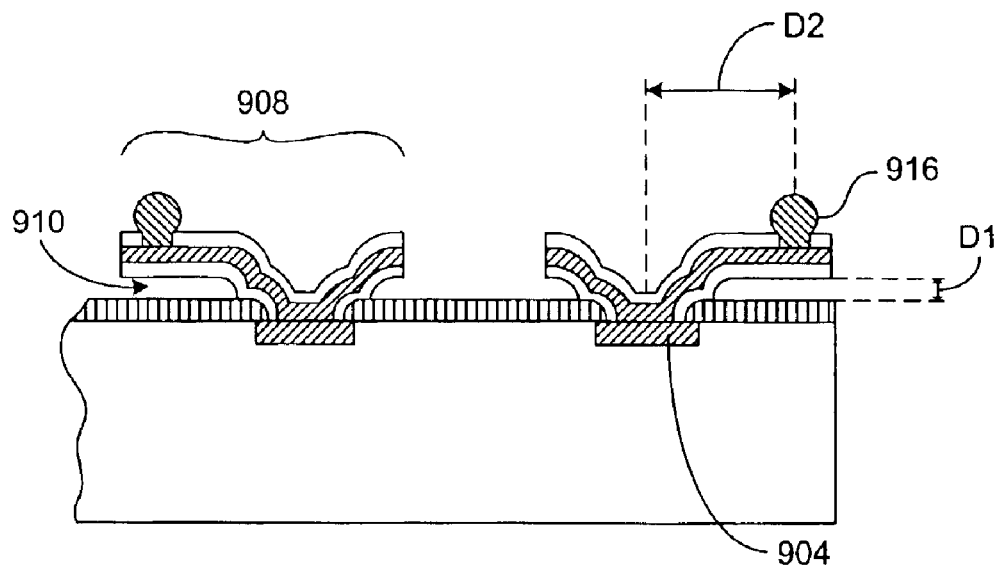
Figure 9N:
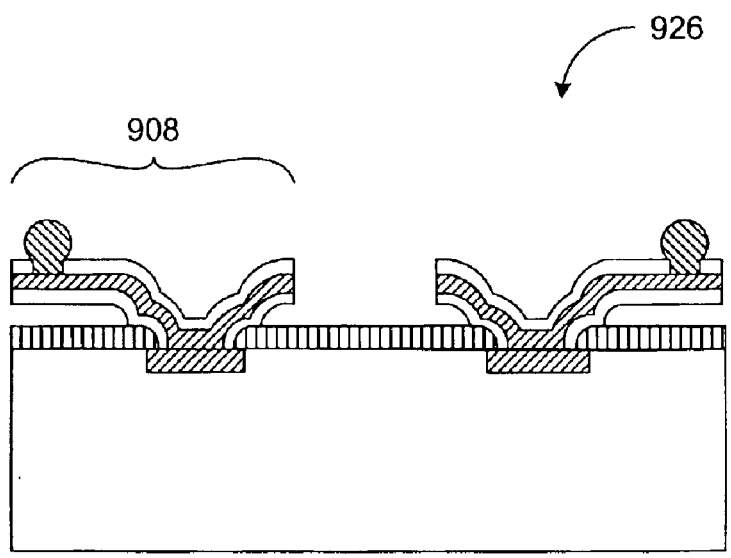

FIGS. 9A–9N are diagrammatic side views of a portion of an integrated circuit wafer as it is fabricated into a wafer level chip scale integrated circuit package in accordance with the embodiment of the method illustrated in the flow chart of FIG. 8.

Initially, in operation 802, an integrated circuit wafer 900 is provided. As shown in FIG. 9A, the wafer 900 typically includes a plurality of bond pads 904 at the top surface of the wafer 900 that connect to the integrated circuit structures of an array of dice 902. As earlier described, the top surface of the die 902 typically takes the form of a passivation layer 906 that has passivation vias, or openings, aligned over the bond pads 904. However, as will be appreciated by those skilled in the art, a wide variety of top surface arrangements may be provided on the die 902. The bond pads 904 may optionally includes under bump metallization pads (not shown) formed over and conductively coupled to the bond pads 904.

In operation 804, a sacrificial layer 918 is deposited on the wafer 900. As shown in FIG. 9B, the sacrificial layer 918 is deposited on the wafer 900 including the bond pads 904. The sacrificial layer 918 may be formed of any material that remains substantially intact through the various process steps described herein and yet is removable prior to singulation without damage to the wafer 900 or the structures formed thereon.

The sacrificial layer 918 may be deposited by any method suitable for producing a substantially even layer on the surface of the wafer 900, such as spinning or printing. In one embodiment, the sacrificial layer 918 may be formed by depositing a layer of a water-soluble material such as WonderMask®W-UVA (manufactured by Techspray, Inc. of Amarillo, Tex.) and spinning it out to form an even layer on the wafer 900. It should be noted that the thickness of the sacrificial layer 918 determines the distance, D1, of the later formed air gap. The thickness of the sacrificial layer 918 may be widely varied in accordance with the needs of a particular system. By way of example, thicknesses in the range of between about 1 $\mu$m to 50 $\mu$m, as for example, 25 $\mu$m, have been found to work well. Additionally, the sacrificial layer 918 serves as an etch barrier over the dice 902 during the formation of the compliant leads 908.

After the sacrificial layer has been applied, vias 922 are formed in the sacrificial layer 918 in operation 806. As shown in FIG. 9C, the vias 922 are formed through the sacrificial layer 918 and the passivation vias 920 exposing the bond pads 904. The vias 922 may be slightly larger than the passivation vias 920 to aid in processing alignment. However, it will be appreciated that this enlargement is not necessary, and the vias 922 may be differently formed, for example, the vias 922 may be substantially the same size as the passivation vias 920. The vias 922 may be formed using conventional photolithography techniques.

The formation of the compliant leads begins in operation 808 with the depositing of an inner resilient layer 914A on the wafer 900. As shown in FIG. 9D, the inner resilient layer 914 is deposited over sacrificial layer 918 including the bond pads 904 and into the vias 922 and 920. The inner resilient layer 914A may be formed of any material that is suitable for absorbing stresses introduced at the contact bump, for example, a polyimide or benzocyclobutene (BCB). The inner resilient layer 914A may be deposited by any method suitable for producing an even layer over the wafer 900, such as spinning or printing. In the present embodiment, the inner resilient layer 914A may be formed by depositing and spinning a layer of benzocyclobutene (BCB) over the wafer. The thickness of the inner resilient layer 914A may be widely varied. By way of example, thicknesses in the range of between about 3 $\mu$m to 8 $\mu$m, as for example, 4.6 $\mu$m, have been found to work well. In other embodiments, the inner resilient layer 914A may be formed by depositing several thin layers of material to "build" the inner resilient layer 914A.

Vias 928 are formed in the inner resilient layer 914A in operation 810. As shown in FIG. 9E, vias 928 are formed in the inner resilient layer 914A exposing the bond pads 904. As shown, the vias 928 are formed smaller than the vias 920 and 922. The vias 928 may be formed using conventional photolithography techniques.

In operation 812 a conductive layer 912 is deposited over the wafer 900. As shown in FIG. 9F, the conductive layer 912 is deposited over the inner resilient layer 914A including the bond pads 904 and into the via 928. The conductive layer 912 may be formed of any conductive material suitable for use in the fabrication process, for example, metals and metal alloys. Further, the conductive layer 912 should be a material that bonds well with the bond pad 904, or, if applicable, the under bump pad formed over the bond pad 904. The conductive layer 912 may be formed of multiple layers of conductive materials or a combination of materials. The conductive layer 912 may be formed using any method suitable to a thin or thick layer deposition of the chosen conductive material, for example, vapor deposition and/or plating. In the present embodiment, the conductive layer 912 may be a sputter-deposited metal layer, such as TiCu. The thickness of the conductive layer 912 may be widely varied. By way of example, thicknesses in the range of between about 10,000 angstroms to 30,000 angstroms, as for example, 22,000 angstroms, have been found to work well.

In other embodiments, the conductive layer 914 may be a sputtered metal layer that is further built up by plating the same or other materials on the sputtered metal layer. Additionally, as earlier described, the materials may be chosen to allow the later deposited contact bumps to be formed by plating.

In operation 814, an outer resilient layer 914B is deposited on the wafer 900. As shown in FIG. 9G, the outer resilient layer 914B is deposited over the conductive layer 912 and may be formed of any material suitable for absorbing stresses introduced at the contact bump. In one preferred embodiment, the material is also photoimageable. For example, some photoresist materials, such as polyimide and benzocyclobutene (BCB), are suitable materials. In the present embodiment, the outer resilient layer 914B may be formed by depositing and spinning a layer of benzocyclobutene (BCB) over the wafer 900. The thickness of the outer resilient layer 914B may be widely varied. By way of example, thicknesses in the range of between about 3 $\mu$m to 8 $\mu$m, as for example, 4.6 $\mu$m, have been found to work well. It will be appreciated that the outer resilient layer 914B and the inner resilient layer 914A may be formed of the same materials or of different materials; however, the selection of different materials may affect the subsequent processing steps. Further, the outer resilient layer 914B may have a different thickness than the inner resilient layer 914A.

In operation 816, vias 924 are formed in the outer resilient layer 914B. As shown in FIG. 9H, the outer resilient layer 914B is patterned according to a predetermined pattern, and portions of the outer resilient layer 914B are removed forming vias 924 exposing the underlying conductive layer 912. As earlier described, a via 924 is formed so that it is offset on the later formed compliant lead a horizontal distance, D2, from the bond pad 904 associated with the compliant lead. Further, a variety of offset distances may be used within the same integrated circuit package. The vias 924 may be formed using conventional photolithography techniques.

In operation 818, contact bumps 916 are formed on the conductive layer 912. As shown in FIG. 9I, contact bumps 916 are formed on and conductively coupled to the conductive layer 912 through the vias 924. The contact bumps 916 may be formed using conventional solder bumping or balling techniques, or by plating as earlier described.

In operation 820, portions of the outer resilient layer 914B are removed. As shown in FIG. 9J, the outer resilient layer 914B is patterned according to a predetermined pattern for forming the compliant leads, and portions of the outer resilient layer 914B that will not form part of the compliant leads are removed, exposing portions of the underlying conductive layer 912. Patterning and removal of portions of the outer resilient layer 914B may be performed using conventional photolithography techniques. It should be noted that the etchant or solvent used to remove portions of the outer resilient layer 914B should not attack the contact bumps 916.

It will be appreciated that if the material of the outer resilient layer 914B is a photoresist material, such as benzocyclobutene (BCB), the patterned outer resilient layer 914B may serve as a mask pattern for subsequent etching of the underlying conductive layer 912 and inner resilient layer 914A. In other embodiments, where a non-photoresist material is used, or for other processing considerations, the mask used to pattern the outer resilient layer 914B may remain in place for use in patterning the underlying layers and then be removed.

In operation 822, portions of the conductive layer 912 are removed. As shown in FIG. 9K, in one embodiment, portions of the conductive layer 912 that will not form part of the compliant leads are removed, exposing the inner resilient layer 914A. Patterning and removal of the portions of the conductive layer 512 may be performed using conventional photolithography techniques. The etchant or solvent used preferably will not attack the contact bumps 916 or the outer resilient layer 914B.

In operation 824, portions of the inner resilient layer 914A are removed. As shown in FIG. 9L, portions of the inner resilient layer 914A are removed exposing the underlying sacrificial layer 918. Patterning and removal of the portions of the inner resilient layer 914A may be performed using conventional photolithography techniques. The etchant or solvent used preferably will not attack the remaining outer resilient layer 914B, the contact bumps 916, or the sacrificial layer 918.

In operation 826, the sacrificial layer 918 is removed. As shown in FIG. 9M, the removal of the sacrificial layer 918 leaves the compliant leads 908 attached to the wafer 900 and forms an air gap 910 having a vertical distance, D1, between the compliant leads 908 and the wafer 900. The sacrificial layer 918 is removed using a process suitable to the material chosen. As earlier described, air gap 910 distances in the range of between about 1 $\mu$m to 50 $\mu$m, as for example, 25 $\mu$m, have been found to work well.

As illustrated, the compliant leads 908 extend horizontally over the wafer 900. The contact bumps 916 are offset on the compliant leads 908 a horizontal distance, D2, from the bond pad 904 coupled with the respective compliant lead 908. As earlier described with reference to FIG. 7, the offset distance, D2, may be measured from the center of he bond pad 904 to the center of the via 924 in which the contact bumps 916 were formed; however, it will be appreciated that other measures of the offset distance may be used. The offset distances may be widely varied. By way of example, horizontal offset distances in the range of between about 50 $\mu$m to 1,000 $\mu$m, as for example, 250 $\mu$m, have been found to work well.

In operation 828, the wafer 900 is singulated. As shown in FIG. 9N, the integrated circuit wafer 900 is singulated into individual wafer level chip scale integrated circuit packages 926. The integrated circuit wafer 900 may be singulated using conventional methods such as laser cutting, or sawing.

Optionally, prior to singulation, in another embodiment, the bottom surface of the wafer 900 may be thinned to reduce the thickness of the packages prior to singulation. Thinning the wafer 900 introduces more compliancy into the later formed wafer level chip scale packages 926 and may provide further mitigation of stresses received by the packages 926 when attached to a substrate. The thinning may be accomplished using conventional wafer thinning techniques, such as grinding.

Following singulation, the individual wafer level chip scale packages 926 are then ready for attachment to other substrates, such as printed circuit boards.

The above embodiments of the present invention have described compliant leads having contact bumps formed on the conductive layer. In some applications, it may be desirable to not apply a contact bump to the compliant leads. Thus, in other embodiments, the contact bumps may be omitted from the earlier described embodiments. In forming these other embodiments, the portion of the conductive layer exposed within the via in the outer resilient layer must be protected from etching at least during the operation in which the conductive layer is etched during formation of the compliant leads. Further, although evident to one skilled in the art, in those embodiments, the operation in which the contact bumps are formed would not be performed.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

We claim:

1. A method for fabricating an integrated circuit package comprising:

providing an integrated circuit wafer, said integrated circuit wafer including a plurality of individual integrated circuit dice, said integrated circuit wafer further having a top surface including a plurality of bond pads which connect to said individual integrated circuit dice and a bottom surface opposite said top surface;

depositing a sacrificial layer over said integrated circuit wafer, said sacrificial layer having vias aligned over said bond pads;

forming compliant leads over said bond pads, each of said compliant leads being conductively coupled to a one of said bond pads through one of said vias;

removing said sacrificial layer, said removing forming an air gap having a vertical distance between said integrated circuit wafer and said compliant leads; and singulating said integrated circuit wafer into individual integrated circuit packages, wherein forming compliant leads over said sacrificial layer further includes depositing a conductive layer over said sacrificial layer including said bond pads;

depositing a resilient layer over said conductive layer;

forming vias in said resilient layer, said vias being formed in said resilient layer a horizontal distance from each of said bond pads to which each of said compliant leads is conductively coupled said conductive layer being exposed within said vias;

forming contact bumps on said conductive layer through said vias, said contact bumps being conductively coupled with said conductive layer;

removing portions of said resilient layer to form the resilient layer of said compliant leads; and removing portions of said conductive layer to form the conductive layer of said compliant leads.

2. The method of claim 1 wherein said vias are formed in said resilient layer a horizontal distance from each of said bond pads to which each of said compliant leads is conductively coupled.

3. The method of claim 2 wherein said horizontal distance is in the range of between about 50 $\mu$m to 1,000 $\mu$m.

4. The method of claim 1 wherein said air gap is a vertical distance in the range of between about 1 $\mu$m to 50 $\mu$m.

5. A method for fabricating an integrated circuit package comprising:
- providing an integrated circuit wafer, said integrated circuit wafer including a plurality of individual integrated circuit dice, said integrated circuit wafer further having a top surface including a plurality of bond pads which connect to said individual integrated circuit dice and a bottom surface opposite said top surface;
- depositing a sacrificial layer over said integrated circuit wafer, said sacrificial layer having vias aligned over said bond pads;
- forming compliant leads over said bond pads, each of said compliant leads being conductively coupled to a one of said bond pads through one of said vias;
- removing said sacrificial layer, said removing forming an air gap having a vertical distance between said integrated circuit wafer and said compliant leads; and
- singulating said integrated circuit wafer into individual integrated circuit packages,
- wherein forming compliant leads over said sacrificial layer further includes
  - depositing an inner resilient layer over said sacrificial layer including said bond pads;
  - removing portions of said inner resilient layer such that said bond pads are exposed;
  - depositing a conductive layer over said inner resilient layer including said bond pads;
  - depositing an outer resilient layer over said conductive layer;
  - forming vias in said outer resilient layer, said vias being formed in said resilient layer a horizontal distance from each of said bond pads to which each of said compliant leads is conductively coupled, said conductive layer being exposed within said vias;
  - forming contact bumps on said conductive layer through said vias, said contact bumps being conductively coupled with said conductive layer;
  - removing portions of said outer resilient layer to form an outer resilient layer of said compliant leads;
  - removing portions of said conductive layer to form a conductive layer of said compliant leads; and
  - removing portions of said inner resilient layer to form an inner resilient layer of said compliant leads.

6. The method of claim 5 wherein said horizontal distance in the range of between about 50 $\mu$m to 1,000 $\mu$m.

7. The method of claim 5 wherein said air gap is a vertical distance in the range of between about 1 $\mu$m to 50 $\mu$m.

* * * * *

UNITED STATES PATENT AND TRADEMARK OFFICE
CERTIFICATE OF CORRECTION

PATENT NO. : 6,900,110 B1
DATED : May 31, 2005
INVENTOR(S) : Takiar et al.

It is certified that error appears in the above-identified patent and that said Letters Patent is hereby corrected as shown below:

Column 4,
Line 64, change "gap 301" to -- gap 310 --.

Column 5,
Line 19, change "other distances" to -- offset distances --.

Column 13,
Line 43, change "he bond" to -- the bond --.

Signed and Sealed this

Twenty-third Day of August, 2005

JON W. DUDAS
*Director of the United States Patent and Trademark Office*